United States Patent [19]

Kwark

[11] Patent Number: 5,189,296
[45] Date of Patent: Feb. 23, 1993

[54] OPTICAL RECEIVER HAVING A LOW CAPACITANCE INTEGRATED PHOTODETECTOR

[75] Inventor: Young H. Kwark, Shrub Oak, N.Y.

[73] Assignee: International Business Machines Corporation, Armonk, N.Y.

[21] Appl. No.: 863,575

[22] Filed: Apr. 3, 1992

[51] Int. Cl.$^5$ ............................................. H01J 40/14
[52] U.S. Cl. .............................. 250/208.2; 250/208.4; 359/189
[58] Field of Search ............... 250/208.2, 208.1, 208.3, 250/208.4, 214 R, 551; 359/189, 157; 330/308, 59; 307/311

[56] References Cited

U.S. PATENT DOCUMENTS

| | | | |
|---|---|---|---|
| 4,070,584 | 1/1978 | Chartraire et al. | 250/208.3 |
| 4,451,842 | 5/1984 | Pommerrenig . | |
| 4,473,745 | 9/1984 | Chown | 359/189 |
| 4,684,966 | 8/1987 | Nishizawa et al. . | |
| 4,904,036 | 2/1990 | Blonder . | |
| 4,975,566 | 12/1990 | Uda | 250/208.2 |
| 5,026,660 | 6/1991 | Dutt et al. . | |
| 5,040,033 | 8/1991 | Dutta et al. . | |
| 5,040,039 | 8/1991 | Hattori et al. . | |

Primary Examiner—David C. Nelms
Assistant Examiner—Que T. Le
Attorney, Agent, or Firm—Blaney Harper

[57] ABSTRACT

The present invention relates to an interconnected array of photodetector cells in which each cell of the photodetector array contains a photodetector for detecting light pulses and a photodetector for switching on the photodetector cell. Each cell has a first and second busbar between which the photodetectors pass current in response to light impinging on the cell. The cells of the array are connected in parallel by the first and second busbars. The photodetectors are formed by depositing electrodes connected to the first and second busbars onto GaAs. The photodetector for detecting light pulses has a significantly faster response to impinging light than the photodetector for switching on the photodetector cell. The faster response of one photodetector with respect to another photodetector can be accomplished by reducing the spacing on GaAs between electrodes forming the faster photodetector, or by adding an integrating capacitor to one photodetector.

15 Claims, 4 Drawing Sheets

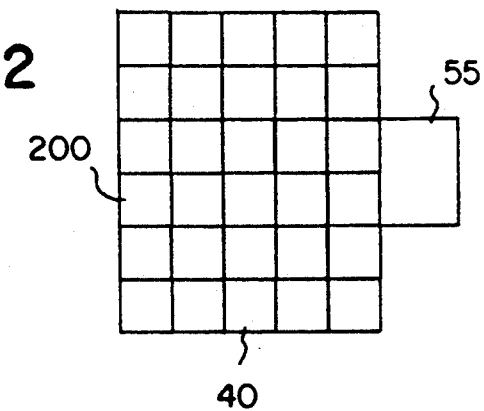
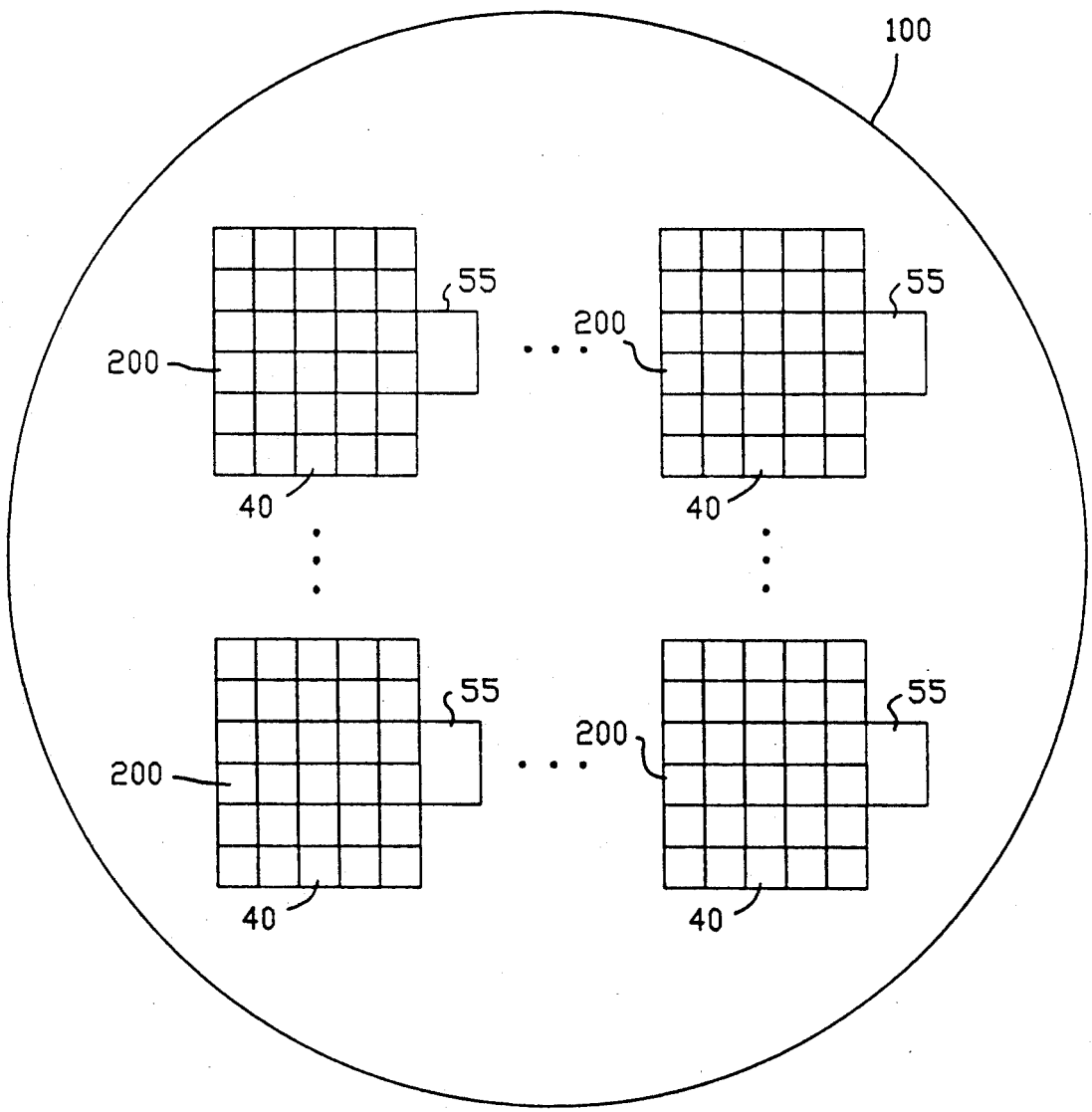

5,189,296

OPTICAL RECEIVER HAVING A LOW CAPACITANCE INTEGRATED PHOTODETECTOR

FIELD OF THE INVENTION

This invention relates generally to the field of semiconductor devices. In particular, this invention relates to light sensitive semiconductor devices. More particularly, this invention relates to a structure of a photodetector circuit which is used to convert a light signal to an electrical signal, and which has a very low capacitance yet a very large geometrical area. This photodetector circuit enables a light transmission media to be inexpensively aligned to a photodetector structure.

BACKGROUND OF THE INVENTION

The rapid increase in computing power has led to distributed computing in which many small computers are spread out among many different people. In this environment, the smaller computers need to communicate with each other and with distant and more powerful larger computers. This type of computing environment is efficient when communication is very fast. This is because each individual computer generates large amounts of data to be transferred between computers and the communications must be very fast so that individual computers will not have to wait for a long time in order to get the data that they require. Optical communication technology is very attractive for this type of application because it transmits large amounts of data very fast. In operation, a first computer sends electrical signals to an optical data link. The optical data link transforms the electrical signals into light signals and transmits the light signals to a second data link over an optical transmission media such as a fiber optic cable. The second data link transforms the light signals to electrical signals and transmits the electrical signals to a second computer.

FIG. 1 illustrates a typical prior art electrical circuit which implements an optical receiver associated with the second optical data link described above. The optical receiver includes an operational amplifier 10, a resistor 20, and a detector 40. Detector 40 has an inherent detector capacitance 45. The connection of the detector 40 to the operational amplifier 10 gives rise to a parasitic capacitance 46. The detector 40 is connected between operational amplifier 10 and bias supply 47. An optical fiber 50 is the light transmission guide which transmits light 15 to the detector 40. The detector 40 converts an optical signal into an electrical current. The electrical current is sent to node 43 which connects the operational amplifier 10 and resistor 20. The combination of the amplifier 10 and the resistor 20 amplifies the electrical signal from the detector and transforms it into a voltage, output at node 52, which can be used by subsequent electrical circuits which decode the information from the electrical signal. The amplitude of an electrical signal generated by the detector compared to the electrical noise generated at node 43 from the amplifier 10 and resistor 20 is commonly referred to as the signal to noise ratio (SNR). The SNR is proportional to the inverse of the square root of the capacitance associated with the detector 40. The capacitance associated with detector 40 includes capacitor 45 and parasitic capacitance 46. In order to obtain a high signal to noise ratio, the capacitance of the detector 45 and the parasitic capacitance 46 must be small. This typically means that the area of the detector 40 must be small to reduce the inherent capacitance of the detector 45. Also, the packaging of the detector 40 must have very little parasitic capacitance which means special packaging must be used to reduce capacitor 46. The noise sensed by the amplifier 10 at node 43 can also be reduced by physically placing the amplifier 10 close to detector 40. Further, the strength of the signal received by detector 40 is increased by transmitting a maximum amount of light to the detector 40 from the optical fiber 50. Even though the amplifier 10 is close to detector 40, the position of the amplifier does not affect the alignment requirements of the optical fiber to the detector 40.

The problem with optical communications in a distributed computing environment is that there are many connections between computers. This is a problem because in order to convert light signals into electrical signals, there must be precise alignment between the transmission media and the light to electrical signal conversion device in the optical data link. In particular, in order for the photodetector to respond fast enough to the data transmitted by the light transmission media, the photodetector must have very little capacitance. Reducing the capacitance of the photodetector requires special packaging which is expensive. Reducing the capacitance of the photodetector also requires a reduction in the area of the photodetector. Reducing the area of the photodetector requires that the alignment between the photodetector and the optical fiber must be very precise. When the alignment is very precise, the interconnections between computers become very expensive. Further, when there are many computers, this expensive connection is multiplied many times. Therefore, the optical communications between computers in a distributed computing environment is very expensive due to the packaging costs and the alignment between the light transmission media and the photodetector.

The prior art has addressed this problem in a variety of ways. A first method is to use adjustable connectors and to adjust the position of the photodetector until the response of the photodetector matches a test light signal. This method provides for low cost connectors but the cost of adjusting the cables everytime a change is made is still very expensive. Additionally, due to the numerical aperture (typically 0.2 to 0.4) of the fiber optic cables, the optical coupling efficiency is very poor which results in poor detector sensitivity. Focusing lenses are commonly used to improve this optical coupling, but the alignment of the lens to the detector is labor intensive and expensive. Another method of improving the effective alignment between the light guide and the photodetector is to merely improve the light sensitivity of the photodetector. The more sensitive the photodetector is, the more misalignment the detector can stand before it is inoperable. This is an improvement, but again, it is not very effective because photodetectors are very light sensitive to begin with. As a result, marginally improving their effectiveness does not give a large enough improvement in alignment. Moreover, improving the response in photodetectors generally involves expensive process steps such as depositing an anti-reflective coating in the light entry area of the photodetector. In either case, the expense of precise alignment is not effectively reduced.

OBJECTS OF THE INVENTION

It is an object of the present invention to manufacture an optical data link.

It is a further object of the present invention to manufacture an inexpensive optical data link which is inexpensive to maintain.

It is still another object of the present invention to manufacture an inexpensive optical data link which has high performance.

It is still a further object of the present invention to manufacture a high performance and inexpensive optical data link.

SUMMARY OF THE INVENTION

The present invention relates to an interconnected array of photodetector cells in which each cell of the photodetector array contains a photodetector for detecting light pulses and a photodetector for switching on the photodetector cell. Each cell has a first and second busbar between which the photodetectors pass current in response to light impinging on the cell. The cells of the array are connected in parallel by the first and second busbars. The photodetectors are formed by depositing electrodes connected to the first and second busbars onto GaAs. The photodetector for detecting light pulses has a significantly faster response to impinging light than the photodetector for switching on the photodetector cell. The faster response of one photodetector with respect to another photodetector can be accomplished by reducing the spacing on GaAs between electrodes forming the faster photodetector, or by adding an integrating capacitor to one photodetector.

BRIEF DESCRIPTION OF THE DRAWINGS

FIG. 2 illustrates a photodetector array according to the present invention.

FIG. 3 illustrates a plurality of photodetector arrays according to the present invention formed on a single substrate.

DESCRIPTION OF THE PREFERRED EMBODIMENT

Figure 1:
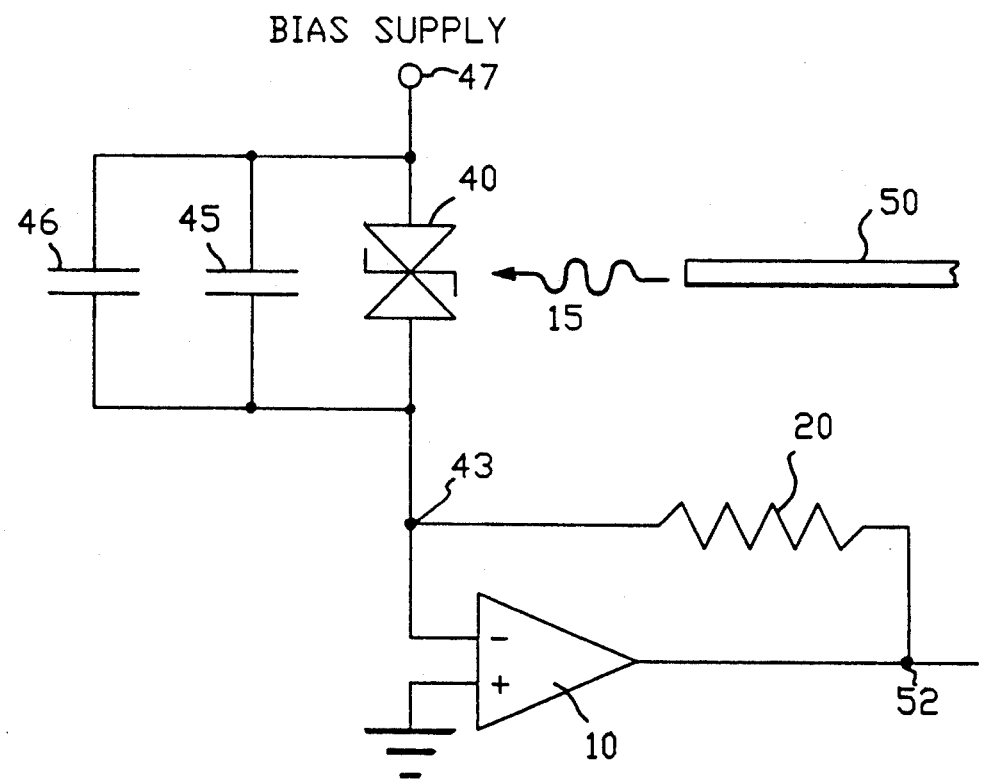
FIG. 1 illustrates a prior art circuit incorporating a photodetector according to the present invention.

FIG. 2 illustrates a block diagram of a photodetector structure according to the present invention in which the effective capacitance of the photodetector is very small yet the alignment area of the detector is large enough to permit inexpensive alignment and connections. A detector array 40 composed of an array of detector cells 200 is formed on a substrate. Amplifier circuitry 55 is formed close to the array 40. The amplifier circuitry includes the operational amplifier 10 and the resistor 20. The gain on the operational amplifier is typically 10, and the resistor value is typically 10 kOhms. These values are conventional design choices and will vary according to the design of each circuit. The array 40 is large enough in area to permit inexpensive alignment to a light transmission guide. For example, a typical array which would be inexpensive to align to a light transmission media would be 0.5×0.5 mm. Much larger (i.e. 2×2 mm) arrays and much smaller (i.e 100×100 microns) could also be built. The size of the array depends on the type of fiber and connector being used. The cell size for each detector cell in the array is typically 50×50 microns. This dimension will vary according to the array size and the dimensions of the light transmission media. FIG. 3 illustrates the formation of a plurality of photodetector structures on a single substrate 100. Each photodetector structure has the amplifier circuit built adjacent to the cell array which helps to minimize noise picked up at node 43.

Figure 4:
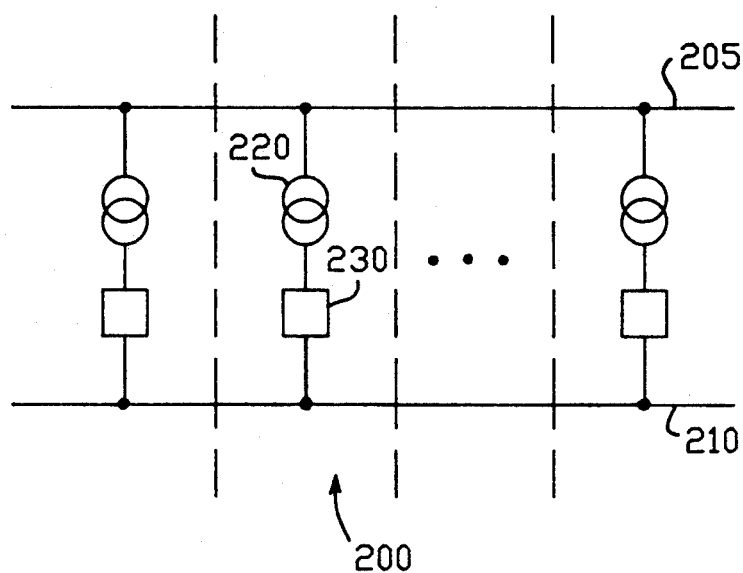
FIG. 4 illustrates an equivalent circuit of a row of a photodetector array according to the present invention.

Each cell 200 within the array 40 includes a photodetector and a light activated switch. FIG. 4 illustrates the equivalent circuit of one row of cells in array 40. Each row of cells has a first busbar 205 connected to a "HI" potential. Each row of cells also has a second busbar 210 connected to a "LOW" potential. Busbars 205 and 210 are connected in parallel for each row of the array 40 and form an input into the amplifier 10. For example, the parallel connection of busbars 205 would form the connection into node 47 of the electrical circuit in FIG. 1 and the parallel connection of busbars 210 would form the input into node 43 of the electrical circuit in FIG. 1. Each cell 200 within the array is composed of a series connection between a photodetector 220 and a light activated switch 230. When light impinges on the switch 230, an electrical connection is made between busbars 210 and the corresponding photodetector 220. When no light impinges on switch 230, it is non-conducting and the electrical connection between busbar 210 and the corresponding photodetector is broken.

Figure 5:
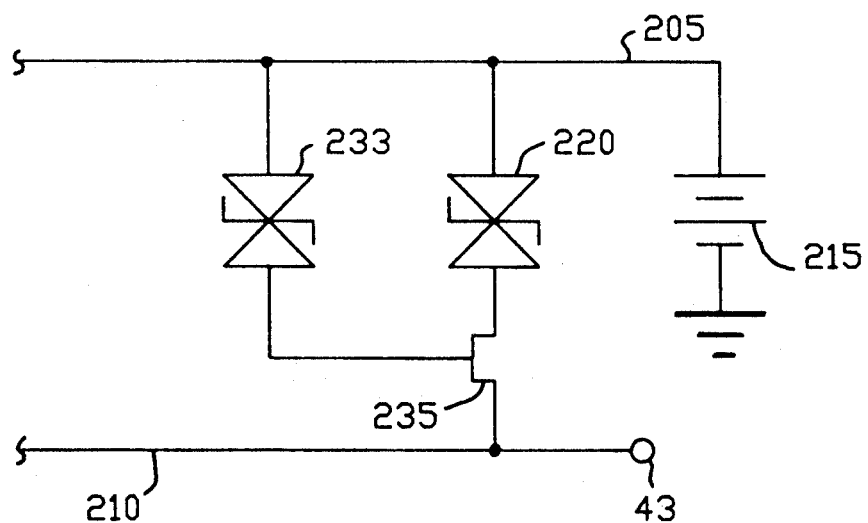
FIG. 5 illustrates an equivalent circuit of a cell of a photodetector array according to the present invention.

FIG. 5 illustrates a more detailed equivalent circuit of cell 200. The switch 230 consists of photodiode 233 and transistor 235. A photodetector 220 is connected in series between busbar 205 and the drain of an enhancement mode transistor 235. The source of the transistor 235 is connected to busbar 210 and the gate of the transistor 235 is connected to a second photodetector 233. The second photodetector 233 is connected in series between busbar 205 and the gate of transistor 235. When light impinges on photodetector 233, a connection is made between busbar 205 and the gate of transistor 235. Busbar 205 is connected to a voltage source 215 which biases busbar 205 with a high potential with respect to busbar 210. The high potential of busbar 205 connected to the gate of transistor 235 when light impinges on photodetector 233 turns on transistor 235 so that an electrical connection is established between the photodetector 220 and the busbar 210.

The light which impinges on photodetector 233 also impinges on photodetector 220 because they are located in the same detector cell 200. Therefore, the operation of the circuit in FIG. 5 depends on the operation of the individual photodetectors. Specifically, photodetector 233 is significantly slower in responding to changes in light intensity than is photodetector 220. The light signal which is transmitted from the light transmission media to the detector array is a series of short light pulses having a high frequency. This type of light signal simulates a constant light source to photodetector 233 because photodetector 233 does not turn off fast enough in between light pulses. In particular, photodetector 233 has a response time which ranges from approximately 10 to 100 times as long as the response time of photodetector 220. In contrast, photodetector 220 has a very fast response time so that it turns on and off with each light pulse. As a result, transistor 235 is turned on by photodetector 233 when a light signal is transmitted to an array cell and the individual light pulses are sensed by photodetector 220 and converted into electrical signals by the electrical circuit of FIG. 5.

Figure 6:
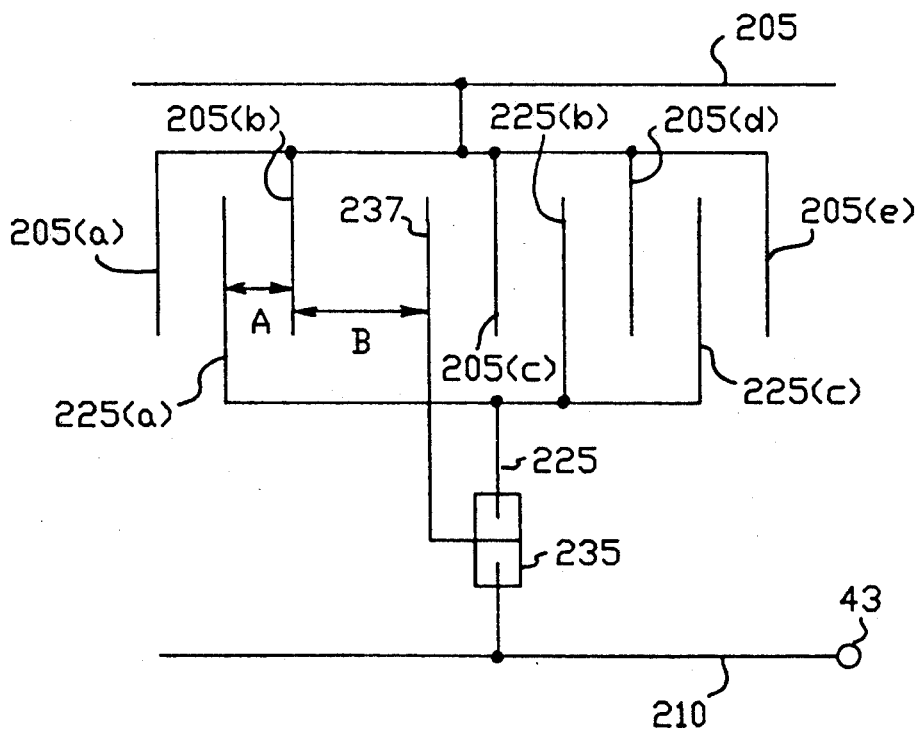
FIG. 6 illustrates electrode spacing of the photodiodes in a photodetector array according to the present invention.

Photodetector 233 has a significantly slower response to a light pulse than photodetector 220. Photodetectors can be fabricated in a variety of ways which meet this requirement. FIG. 6 illustrates a particular embodiment of the circuit of FIG. 5 in GaAs technology. A photodiode can be fabricated in GaAs by merely depositing two conductors made from a material such as a conventional tungsten silicide (WSi) alloy deposited onto the GaAs and separated by an appropriate distance. FIG. 6 illustrates several electrodes 205 (a–e) connected to busbar 205. Electrodes 225 (a–c) are interposed between electrodes 205 (a–e) and connected to the drain of transistor 235. The source of transistor 235 is connected to the busbar 210. When light impinges on the GaAs between electrodes 205(a,b) and 225(a), current flows between the electrodes 205(a,b) and 225(a) and the electrodes separated by GaAs act as a photodiode 220. The speed with which the current is generated between the electrodes depends on the spacing between electrodes 205(a,b) and 225(a). When there is a small space, on the order of 2 microns, the diode 220 can operate at 2 GHz or higher. When there is a large space, the diode is slower because the photogenerated carriers are collected at a slower rate. Electrodes 205(a–e) are formed in an interdigitated design with electrodes 225(a–c) such that current is generated between a plurality of electrodes attached to the busbar 205 and a plurality of electrodes attached to electrode 225.

FIG. 6 illustrates that photodetector 233 is formed in the same fashion as photodetector 220. In particular, a plurality of electrodes attached to the gate of transistor 235 are interposed between a plurality of electrodes attached to busbar 205. The spacing B between an electrode attached to the gate of transistor 235, such as electrode 237, and an electrode 205(b,c) attached to busbar 205 is wider than the spacing in photodetector 220, labeled A. For example, when the spacing A in photodetector 220 is 2 microns, the spacing B in photodetector 233 is approximately 10 microns. This added spacing between the electrodes of the photodetector slows down the operation of the diode formed by the electrodes and the GaAs, and makes the photodetector 233 respond slowly (approximately 20–200 MHz) to changes in light intensity. Adjusting the finger spacing in the photodetectors adjusts the response rate of the photodetectors to suit the required data rate of the optical receiver.

Figure 7:
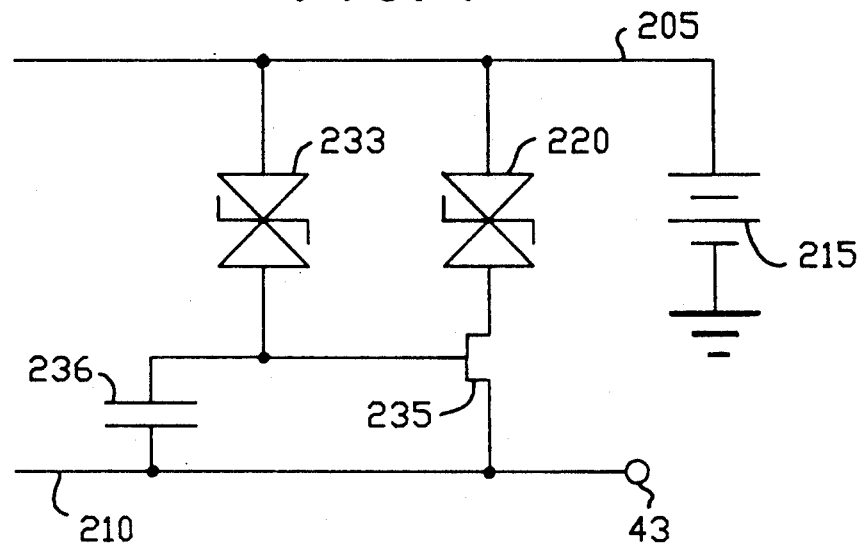
FIG. 7 illustrates an equivalent circuit of an alternate embodiment of a cell of a photodetector array according to the present invention.
Figure 8:
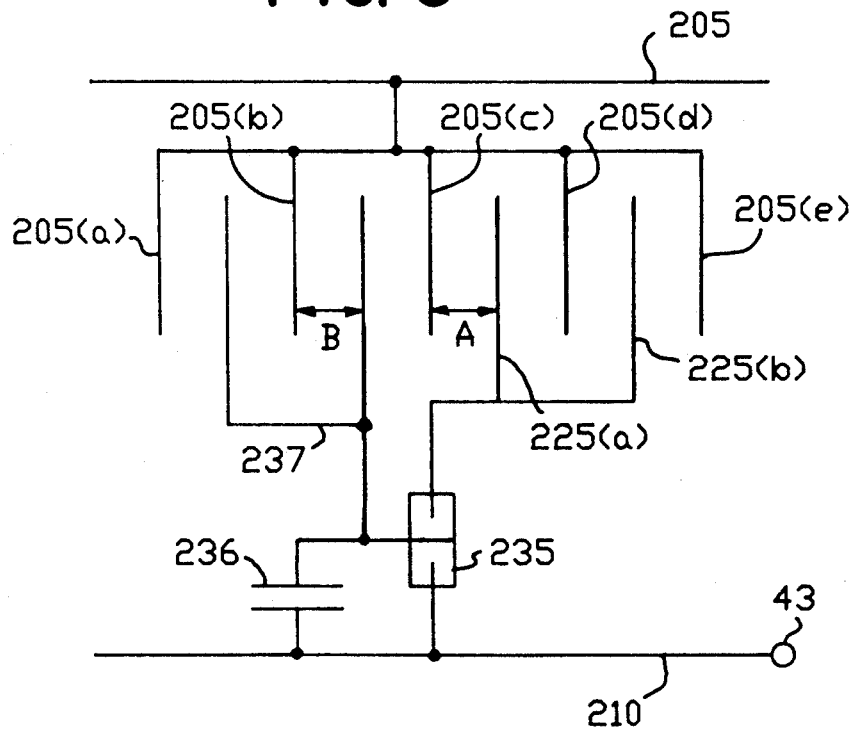
FIG. 8 illustrates electrode spacing of the photodiodes of an alternate embodiment of a photodetector array according to the present invention.

FIG. 7 and 8 illustrate an alternate embodiment of the photodetector circuit. FIG. 7 illustrates that photodetector 220 is connected between busbar 205 and the drain of transistor 235. The source of transistor 235 is connected to busbar 210. The gate of transistor 235 is connected to photodetector 233 and capacitor 236. Photodetector 233 is further connected to busbar 205 and capacitor 236 is further connected to busbar 210. In this embodiment of the present invention, capacitor 236 acts as an integrator to slow the response of photodetector 233 in generating a voltage for turning on transistor 235. In this way, the relative response time for photodector 233 can be similar to photodetector 220 yet not change the operation of the circuit. In particular, a capacitance of approximately 200 femtofarads, in capacitor 236 can reduce the effective response for photodetector 233 (at the gate of transistor 235) from 2 Ghz to approximately 2 MHz. Moreover, a combination of an integrating capacitor 236 and a differential spacing between electrodes can also reduce the effective bandwidth time. FIG. 8 illustrates the design of photodetector 220 and 233 when implemented with integrating capacitor 236. The spacing A between the electrodes 205(c,d,e) and 225(a,b) are the same as the spacing B between electrodes 237 and 205(a,b).

Each cell 200 of the array 40 of FIG. 2 has its own switch and all of the cells of the array 40 are connected in parallel to busbars 205 and 210. This interconnection is important in order to facilitate easy alignment between the optical transmission media and the photodetector array with minimum capacitance. In particular, the optical transmission media can align with any one cell or small group of cells and the light signal converted to electrical signals will be converted from that cell or group of cells. If a group of cells is activated by the light, the parallel connection between the cells insures that the single signal from the light source is not divided into several signals with different phases. Additionally, those cells which are not aligned to the light transmission media are turned off. Turning off those cells which are not sensing light decreases the capacitance associated with the photodetector 40 and increases the signal to noise ratio of the electrical signal produced at node 43 of FIG. 1. Moreover, the detector array can be as large as is convenient without increasing the capacitance 45 or the SNR. As a result, the optical transmission media can be inexpensively aligned to any position within the photodetector array 40 and have the optical signal converted to an electrical signal with a minimum effect from the capacitance of the photodector array 40 because those parts of the photodetector array 40 which do not receive light are turned off. The use of this type of photodetector makes inexpensive optical interconnections because there is no necessity for precise alignment of the optical transmission media to the photodetector. Merely aligning the optical transmission media to a larger array is sufficient and this can be done by conventional and inexpensive techniques.

While the invention has been described and illustrated with respect to plural embodiments thereof, it will be understood by those skilled in the art that various changes in the detail may be made therein without departing from the spirit, scope, and teaching of the invention. In particular, the embodiments described herein refer to GaAs implementations of the invention. This invention also contemplates silicon or other semiconductor embodiments including but not limited to silicon bipolar and MOS embodiments. Therefore, the invention disclosed herein is to be limited only as specified in the following claims.

Having thus described our invention what we claim as new and desire to secure as Letters Patent, is:

1. An optical receiver, comprising:
   a plurality of photodetector cells, each of said photodetector cells having first and second photodiodes for converting light energy into electrical signals;
   said first photodiode connected to a switch means for connecting said second photodiode to an output of said photodetector cell when said first photodiode detects light energy; and said output from each of said plurality of photodetector cells connected in parallel.

2. An optical receiver, as in claim 1, wherein:

said first photodiode responds to said light energy slower than said second photodiode.

3. An optical receiver, as in claim 2, wherein:

said switch means comprises a transistor, said transistor having a gate connected to said first photodiode, a drain connected to said second photodiode, and a source connected to said output.

4. An optical receiver, as in claim 1, further comprising:

a delay means connected to said first photodiode for delaying the response of said first photodiode to said light energy.

5. An optical receiver, as in claim 4, wherein:

said delay means comprises a capacitor, said capacitor connected between said first photodiode and said output; and said switch means comprises a transistor, said transistor having a gate connected to said first photodiode, a drain connected to said second photodiode, and a source connected to said output.

6. An optical data link for receiving optical signals and transmitting electrical signals which correspond to said optical signals to a data processing system, comprising:

a plurality of photodetector cells, each of said photodetector cells having first and second photodiodes for converting light energy into electrical signals;

said first photodiode connected to a switch means for connecting said second photodiode to an output of said photodetector cell when said first photodiode detects said light energy;

said output from each of said plurality of photodetector cells connected in parallel; and an amplifier means connected to said output for amplifying said electrical signals and transmitting said amplified electrical signals to said data processing system.

7. An optical data link, as in claim 6, wherein:

said first photodiode responds to said light energy slower than said second photodiode.

8. An optical data link, as in claim 7, wherein:

said switch means comprises a transistor, said transistor having a gate connected to said first photodiode, a drain connected to said second photodiode, and a source connected to said output.

9. An optical data link, as in claim 6, further comprising:

a delay means connected to said first photodiode for delaying the response of said first photodiode to said light energy.

10. An optical data link, as in claim 9, wherein:

said delay means comprises a capacitor, said capacitor connected between said first photodiode and said output; and said switch means comprises a transistor, said transistor having a gate connected to said first photodiode, a drain connected to said second photodiode, and a source connected to said output.

11. A method of converting optical signals to electrical signals, comprising:

aligning an optical transmission media to a photodetector array, said photodetector array having a plurality of cells wherein each of said plurality of cells comprises a detector and a switch photodiode, said switch photodiode connects said detector photodiode between a high and a low potential when light activates said switch photodiode, said detector photodiode transmits current between a high and a low potential when light activates said detector photodiode;

transmitting optical signals from said optical transmission media to at least one of said cells in said photodetector array;

activating at least one of said switch and detector photodiodes in said plurality of cells of said photodetector array by said transmitted optical signal; and preventing the activation of at least one of said switch photodiodes in said plurality of cells of said photodetector array.

12. A method of converting optical signals to electrical signals, as in claim 11, wherein:

said switch photodiode activates slower than said detector photodiode.

13. A method of converting optical signals to electrical signals, as in claim 12, wherein:

said switch photodiode is connected to a gate of a transistor and said transistor has a drain connected to said detector photodiode and a source connected to said low potential.

14. A method of converting optical signals to electrical signals, as in claim 11, wherein:

said switch photodiode is connected to a delay means, said delay means delays activation of said switch transistor.

15. A method of converting optical signals to electrical signals, as in claim 14, wherein:

said switch photodiode is connected to a gate of a transistor and said transistor has a drain connected to said detector photodiode and a source connected to said low potential.

* * * * *